United States Patent
Moussa et al.

(10) Patent No.: US 6,833,231 B2
(45) Date of Patent: Dec. 21, 2004

(54) TOUGHENED STEREOLITHOGRAPHIC RESIN COMPOSITIONS

(75) Inventors: Khalil M. Moussa, Stevenson Ranch, CA (US); Jiaching Liu, Valencia, CA (US)

(73) Assignee: 3D Systems, Inc., Valencia, CA (US)

(*) Notice: Subject to any disclaimer, the term of this patent is extended or adjusted under 35 U.S.C. 154(b) by 115 days.

(21) Appl. No.: 10/209,788

(22) Filed: Jul. 31, 2002

(65) Prior Publication Data

US 2004/0023145 A1 Feb. 5, 2004

(51) Int. Cl.$^7$ .......... G03F 7/075; G03F 7/028; G03F 7/029; G03F 7/031; B29C 35/08
(52) U.S. Cl. .......... 430/280.1; 430/269; 430/138; 430/920; 430/905; 522/15; 522/103; 522/100; 522/8; 522/77; 522/121; 522/170; 264/401
(58) Field of Search .......... 430/280.1, 269; 522/170; 264/401

(56) References Cited

U.S. PATENT DOCUMENTS

| | | | |
|---|---|---|---|
| 4,594,291 A | | 6/1986 | Bertram et al. |
| 5,360,877 A | | 11/1994 | Hwang et al. |
| 5,434,196 A | | 7/1995 | Ohkawa et al. |
| 5,495,029 A | * | 2/1996 | Steinmann et al. ...... 430/280.1 |
| 5,599,651 A | * | 2/1997 | Steinmann et al. ...... 430/280.1 |
| 5,605,941 A | * | 2/1997 | Steinmann et al. ......... 522/170 |
| 5,874,041 A | | 2/1999 | Matsumura et al. |
| 5,972,563 A | | 10/1999 | Steinmann et al. |
| 6,100,007 A | | 8/2000 | Pang et al. |
| 6,136,497 A | | 10/2000 | Melisaris et al. |
| 6,251,557 B1 | | 6/2001 | Lapin et al. |
| 6,287,748 B1 | | 9/2001 | Lawton |

FOREIGN PATENT DOCUMENTS

| | | | | |
|---|---|---|---|---|
| EP | 0551989 A1 | * | 7/1993 | ........... C08G/59/22 |

OTHER PUBLICATIONS

Tactix 695—Toughened Epoxy Resin—Product Data sheet, 2 pages.

* cited by examiner

*Primary Examiner*—Cynthia Hamilton
(74) *Attorney, Agent, or Firm*—William A. Simons; Ralph D'Alessandro

(57) ABSTRACT

A liquid radiation-curable composition that comprises
(A) at least one polymerizing organic substance;
(B) at least one free-radical polymerizing organic substance;
(C) at least one cationic polymerization initiator;
(D) at least one free-radical polymerization initiator;
(E) at least one hydroxyl-functional compound; and
(F) at least one epoxy interpenetrating polymer compound;

25 Claims, No Drawings

TOUGHENED STEREOLITHOGRAPHIC RESIN COMPOSITIONS

BACKGROUND OF THE INVENTION

1. Field of the Invention

The present invention relates to selected liquid, radiation-curable compositions which are particularly suitable for the production of three-dimensional articles by stereolithography as well as a process for the production of cured articles and the cured three-dimensional shaped article themselves. In particular, this invention relates to a liquid, radiation-curable resin compositions from which cured three-dimensional shaped articles having very high impact resistance characteristic of ABS resins can be made.

2. Brief Description of Art

The production of three-dimensional articles of complex shape by means of stereolithography has been known for a relatively long time. In this technique the desired shaped article is built up from a liquid, radiation-curable composition with the aid of a recurring, alternating sequence of two steps (a) and (b); in step (a), a layer of the liquid, radiation-curable composition, one boundary of which is the surface of the composition, is cured with the aid of appropriate radiation, generally radiation produced by a preferably computer-controlled laser source, within a surface region which corresponds to the desired cross-sectional area of the shaped article to be formed, at the height of this layer, and in step (b) the cured layer is covered with a new layer of the liquid, radiation-curable composition, and the sequence of steps (a) and (b) is repeated until a so-called green model of the desired three-dimensional shape is finished. This green model is, in general, not yet fully cured and must therefore, normally, be subjected to post-curing.

The mechanical strength of the green model (modulus of elasticity, fracture strength), also referred to as green strength, constitutes an important property of the green model and is determined essentially by the nature of the stereolithographic-resin composition employed. Other important properties of a stereolithographic resin composition include a high sensitivity for the radiation employed in the course of curing and a minimum curl factor, permitting high shape definition of the green model. In addition, for example, the precured material layers should be readily wettable by the liquid stereolithographic resin composition, and of course not only the green model but also the ultimately cured shaped article should have optimum mechanical properties.

In order to achieve the desired balance of properties, different types of resin systems have been proposed. For example, radical-curable resin systems have been proposed. These systems generally consist of one or more (meth)acrylate compounds (or other free-radical polymerizable organic compounds) along with a free-radical photoinitiator for radical generation. U.S. Pat. No. 5,418,112 describes one such radical-curable system.

Another type of resin composition suitable for this purpose is a dual type system that comprises (i) epoxy resins or other types of cationic polymerizable compounds; (ii) cationic polymerization initiator; (iii) acrylate resins or other types of free radical polymerizable compounds; and (iv) a free radical polymerization initiator. Examples of such dual or hybrid systems are described in U.S. Pat. No. 5,434,196.

A third type of resin composition useful for this application also includes (v) hydroxyl-containing compounds such as polyether-polyols. Examples of such hybrid systems are described in U.S. Pat. Nos. 5,972,563; 6,100,007 and 6,287,748.

Separately, epoxy interpenetrating polymer networks or so-called toughened epoxy resins such as Taxtic 695 (commercially available from Vantico, Inc. of Brewster, N.Y.) have been used alone or in additives to other resins to increase toughness. Epoxy interpenetrating polymer networks (called an EPRXE resin wherein a diepoxy resin is involved) resins containing epoxy functions along with other moieties. Taxtic 695 is a particular EPRXE resin and its formula is shown on columns 10 and 11 of U.S. Pat. No. 5,360,877. In the past, these resins were cured with a variety of amine and anhydride-based curing agents. It is believed such toughened epoxy resins have not been used in stereolithographic resin applications.

Despite all previous attempts, there exists a need for a liquid hybrid stereolithographic composition capable of producing cured articles that possess very high impact resistance characteristic of ABS resins along with other mechanical and chemicals desired in stereolithographic resins. The present invention presents a solution to that need.

BRIEF SUMMARY OF THE INVENTION

Therefore, one aspect of the present invention is directed to a liquid radiation-curable composition useful for the production of three dimensional articles by stereolithography that comprises (A) at least one cationically polymerizing organic substance;

(B) at least one free-radical polymerizing organic substance;

(C) at least one cationic polymerization initiator;

(D) at least one free-radical polymerization initiator;

(E) at least one hydroxyl-functional compound; and (F) at least one epoxy interpenetrating polymer compound.

Another aspect of the present invention is directed to a process for forming a three-dimensional article, said process comprising the steps:

(1) coating a thin layer of a radiation-curable composition onto a surface;

(2) exposing said thin layer imagewise to actinic radiation to form an imaged cross-section, wherein the radiation is of sufficient intensity to cause substantial curing of the thin layer in the exposed areas;

(3) coating a thin layer of the composition onto the previously exposed imaged cross-section;

(4) exposing said thin layer from step (3) imagewise to actinic radiation to form an additional imaged cross-section, wherein the radiation is of sufficient intensity to cause substantial curing of the thin layer in the exposed areas and to cause adhesion to the previously exposed imaged cross-section;

(5) repeating steps (3) and (4) a sufficient number of times in order to build up the three-dimensional article;

wherein the radiation-curable composition is that which is described above.

Still another aspect of the present invention is directed to three-dimensional articles made by the above process using the above-noted radiation-curable composition.

It is an advantage that the liquid radiation-curable composition of the present invention provides parts with high modulus of flexure and tensile when used in a stereolithography system to form a three-dimensional object.

It is another advantage that the liquid radiation-curable composition of the present invention provides parts with good elongation to break and which are not brittle when used in a stereolithography system to form a three-dimensional object.

It is yet another advantage that the liquid radiation-curable composition of the present invention provides parts with stable properties in the presence of moisture when used in a stereolithography system to form a three-dimensional object.

It is still another advantage that the liquid radiation-curable composition of the present invention provides a resin material that permits a reliable process to produce high quality three-dimensional parts to be easily designed.

DETAILED DESCRIPTION OF THE INVENTION

The term "(meth)acrylate" as used in the present specification and claims refers to both acrylates and methacrylates.

The term "liquid" as used in the present specification and claims is to be equated with "liquid at room temperature" which is, in general, a temperature between 5° C. and 30° C.

The novel compositions herein contain, in the broadest sense, a mixture of at least one cationically polymerizable organic substances; at least one selected free-radical polymerizing organic substance; at least one cationic polymerization initiator; at least one free-radical polymerization initiator; at least one hydroxyl-functional compound and at least one epoxy interpenetrating polymer compound. The compositions may further optionally contain other additives.

(A) Cationically Polymerizable Organic Substances

The cationically polymerizable compound may expeditiously be an aliphatic, alicyclic or aromatic polyglycidyl compound or cycloaliphatic polyepoxide or epoxy cresol novolac or epoxy phenol novolac compound and which on average possess more than one epoxide group (oxirane ring) in the molecule. Such resins may have an aliphatic, aromatic, cycloaliphatic, araliphatic or heterocyclic structure; they contain epoxide groups or side groups or these groups form part of an alicyclic or hetrocyclic ring system. Epoxy resins of these types are known in general terms and are commercially available.

Examples of such suitable epoxy resins are disclosed in U.S. Pat. No. 6,100,007.

Also conceivable is the use of liquid prereacted adducts of epoxy resins, such as those mentioned above, with hardeners for epoxy resins.

It is of course also possible to use liquid mixtures of liquid or solid epoxy resins in the novel compositions.

Examples of cationically polymerizable organic substances other than epoxy resin compounds include oxetane compounds, such as trimethylene oxide, 3,3-dimethyloxetane and 3,3-dichloromethyloxethane, 3-ethyl-3-phenoxymethyloxetane, and bis(3-ethyl-3-methyloxy) butane; oxolane compounds, such as tetrahydrofuran and 2,3-dimethyl-tetrahydrofuran; cyclic acetal compounds, such as trioxane, 1,3-dioxalane and 1,3,6-trioxan cycloctane; cyclic lactone compounds, such as β-propiolactone and ε-caprolactone; thiirane compounds, such as ethylene sulfide, 1,2-propylene sulfide and thioepichlorohydrin; thiotane compounds, such as 1,3-propylene sulfide and 3,3-dimethylthiothane.

Examples of such other cationically polymerizable compounds are also disclosed in U.S. Pat. No. 6,100,007.

Preferably, the cationically polymerizable compounds of the present invention constitute about 30% to 80% by weight of the radiation-curable composition.

One particularly preferred embodiment of the present invention contains two types of cationically polymerizing organic substances. One type is an alicylic epoxide having at least one to two epoxy groups. The other type is at least one difunctional or higher functional-glycidylether of polyhydric compound.

(1) Alicyclic Epoxides Having at Least Two Epoxy Groups

The cationically polymerizing alicyclic epoxides having at least two epoxy groups include any cationically curable liquid or solid compound that may be an alicyclic polyglycidyl compound or cycloaliphatic polyepoxide which on average possesses two or more epoxide groups (oxirane rings) in the molecule. Such resins may have a cycloaliphatic ring structure that contain the epoxide groups as side groups or the epoxide groups from part of the alicyclic ring structure. Such resins of these types are known in general terms and are commercially available.

Examples of compounds in which the epoxide groups from part of an alicyclic ring system include bis(2,3-epoxycyclopentyl) ether, 2,3-epoxycyclopentyl glycidyl ether, 1,2-bis(2,3-epoxycyclopentyloxy)ethane, bis(4-hydroxycyclohexyl) methane diglycidyl ether, 2,2-bis(4-hydroxycyclohexyl) propane diglycidyl ether, 3,4-epoxycyclohexylmethyl-3',4'-epoxycyclohexanecarboxylate, 3,4-epoxy-6-methyl-cyclohexylmethyl 3,4-epoxy-6-methylcyclohexanecarboxylate, di(3,4-epoxycyclohexylmethyl) hexanedioate, di(3,4-epoxy-6-methylcyclohexylmethyl) hexanedioate, ethylenebis(3,4-epoxycyclohexane-carboxylate, ethanediol di(3,4-epoxycyclohexylmethyl) ether, vinylcyclohexene dioxide, dicyclopentadiene diepoxide or 2-(3,4-epoxycyclohexyl-5,5-spiro-3,4-epoxy)cyclohexane-1,3-dioxane.

The preferred alicyclic epoxide is 3,4-epoxycyclohexylmethyl-3',4'-epoxy-cyclohexanecarboxylate which is available as Cyracure UVR 6110.

For this particularly preferred embodiment, these alicyclic epoxides preferably constitute from about 50% to about 90% by weight, more preferably from about 60% to 85% by weight; of the total cationic polymerizing organic substances.

(2) Difunctional or Higher Functional Glycidylethers of a Polyhydric Compound

The cationically polymerizing difunctional or higher functionality glycidylethers of a polyhydric compound are obtainable by reacting a compound having at least two free alcoholic hydroxyl groups with a suitably substituted epichlorohydrin under alkaline conditions or in the presence of an acidic catalyst followed by alkali treatment. Ethers of this type may be derived from acyclic alcohols, such as ethylene glycol, propane-1,2-diol or poly (oxy propylene) glycols, propane-1,3-diol, butane-1,4-diol, poly (oxytetramethylene) glycols, pentane-1,5-diols, hexane-1,6-diol, hexane-2,4-,6-triol, glycerol, 1,1,1-trimethylol propane, bistrimethylol propane, pentacrythritol, sorbitol and the like when reacted with polyepichlorohydrins. Such resins of these types are known in general terms and are commercially available.

The most preferred difunctional or higher functional glycidylether is trimethylol propane triglycidylether which is available as Araldite DY-T.

For this particular preferred embodiment, these difunctional or higher functional glycidylether preferably constitute from about 10% to about 50% by weight, more preferably about 15% to about 40% by weight of the total cationic polymerizing organic substances.

(B) Free-Radical Polymerizing Organic Substance

The free radically curable component preferably comprises at least one solid or liquid poly(meth)acrylate, for example, be di-, tri-, tetra- or pentafunctional monomeric or oligomeric aliphatic, cycloaliphatic or aromatic acrylates or methacrylates. The compounds preferably have a molecular weight of from 200 to 500.

Examples of suitable aliphatic poly(meth)acrylates having more than two unsaturated bonds in their molecules are the triacrylates and trimethacrylates of hexane-2,4,6-triol, glycerol or 1,1,1-trimethylolpropane, ethoxylated or propoxylated glycerol or 1,1,1-trimethylolpropane, and the hydroxyl-containing tri(meth)acrylates which are obtained by reacting triepoxide compounds, for example the triglycidyl ethers of said triols, with (meth)acrylic acid. It is also possible to use, for example, pentaerythritol tetraacrylate, bistrimethylolpropane tetraacrylate, pentaerythritol monohydroxytriacrylate or -methacrylate, or dipentaerythritol monohydroxypentaacrylate or -methacrylate.

It is additionally possible, for example, to use polyfunctional urethane acrylates or urethane methacrylates. These urethane (meth)acrylates are known to the person skilled in the art and can be prepared in a known manner by, for example, reacting a hydroxyl-terminated polyurethane with acrylic acid or methacrylic acid, or by reacting an isocyanate-terminated prepolymer with hydroxyalkyl (meth)acrylates to give the urethane (meth)acrylate.

Preferably, these free radical polymerizable compounds constitute about 5% to about 15% of the radiation-curable composition.

One particularly preferred class of free radical polymerizable compounds are aromatic di(meth) acrylate compounds. Optionally, this particular preferred embodiment also contains a trifunctional or higher functionality (meth) acrylate compound.

(1) Aromatic Di(meth)acrylate Compounds

The aromatic di(meth)acrylate compounds include difunctional aromatic acrylates or difunctional aromatic methacrylates. Suitable examples of these di(meth)acrylate compounds include di(meth)acrylates of aromatic diols such as hydroquinone, 4,4'-dihydroxybis-phenyl, bisphenol A, bisphenol F, bisphenol S, ethoxylated or propoxylated bisphenol A, ethoxylated or propoxylated bisphenol F or ethoxylated or propoxylated bisphenol S. Di(meth)acrylates of this kind are known and some are commercially available.

The most preferred aromatic difunctional (meth)acrylate is bisphenol A diglycidylether diacrylate which is available as Ebecryl 3700.

These aromatic difunctional (meth)acrylates preferably constitute from about 5% to about 15% by weight, more preferably, from about 5% to about 10% by weight of the total liquid radiation-curable composition.

(2) Optional Trifunctional or Higher Functionality (Meth)acrylate Compounds

The optional trifunctional or higher functionality meth (acrylates) are preferably tri-, tetra- or pentafunctional monomeric or oligomeric aliphatic, cycloaliphatic or aromatic acrylates or methacrylates. Such compounds preferably have a molecular weight of from 200 to 500.

Examples of suitable aliphatic tri-, tetra- and pentafunctional (meth)acrylates are the triacrylates and trimethacrylates of hexane-2,4,6-triol, glycerol or 1,1,1-trimethylolpropane, ethoxylated or propoxylated glycerol or 1,1,1-trimethylolpropane, and the hydroxyl-containing tri (meth)acrylates which are obtained by reacting triepoxide compounds, for example the triglycidyl ethers of said triols, with (meth)acrylic acid. It is also possible to use, for example, pentaerythritol tetraacrylate, bistrimethylolpropane tetraacrylate, pentaerythritol monohydroxytriacrylate or -methacrylate, or dipentaerythritol monohydroxypentaacrylate or -methacrylate.

Examples of suitable aromatic (tri)methacrylates are the reaction products of triglycidyl ethers of trihydric phenols and phenol or cresol novolaks containing three hydroxyl groups, with (meth)acrylic acid.

These higher functional (meth) acrylates are known compounds and some are commercially available, for example from the SARTOMER Company under product designations such as SR295, SR350, SR351, SR367, SR399, SR444, SR454 or SR9041.

The most preferred higher functional (meth)acrylate compound is SARTOMER SR399, which dipentaerythritol monohydroxy-pentaacrylate.

These optional higher functional (meth)acrylates, if used, preferably constitute about 1% to about 3% by weight, more preferably, from about 1.5% to about 3% by weight of the total liquid radiation-curable composition.

(C) Cationic Polymerization Initiators

In the compositions according to the invention, any type of photoinitiator that, upon exposure to actinic radiation, forms cations that initiate the reactions of the epoxy material (s) can be used. There are a large number of known and technically proven cationic photoinitiators for epoxy resins that are suitable. They include, for example, onium salts with anions of weak nucleophilicity. Examples are halonium salts, iodonium salts or sulfonium salts, such as described in published European patent application EP 153904, sulfoxonium salts, such as described, for example, in published European patent applications EP 35969, 44274, 54509, and 164314, or diazonium salts, such as described, for example, in U.S. Pat. Nos. 3,708,296 and 5,002,856. Other cationic photoinitiators are metallocene salts, such as described, for example, in published European applications EP 94914 and 94915. Other preferred cationic photoinitiators are mentioned in U.S. Pat. Nos. 5,972,563 (Steinmann et al.); 6,100,007 (Pang et al.) and 6,136,497 (Melisaris et al.).

More preferred commercial cationic photoinitiators are UVI-6974, UVI-6970, UVI-6990 (manufactured by Union Carbide Corp.), CD-1010, CD-1011, CD-1012 (manufactured by Sartomer Corp.), Adekaoptomer SP-150, SP-151, SP-170, SP-171 (manufactured by Asahi Denka Kogyo Co., Ltd.), Irgacure 261 (Ciba Specialty Chemicals Corp.), CI-2481, CI-2624, CI-2639, CI-2064 (Nippon Soda Co., Ltd.), DTS-102, DTS-103, NAT-103, NDS-103, TPS-103, MDS-103, MPI-103, BBI-103 (Midori Chemical Co., Ltd.). Most preferred are UVI-6974, CD-1010, UVI-6970, Adekaoptomer SP-170, SP-171, CD-1012, and MPI-103. The above mentioned cationic photo-initiators can be used either individually or in combination of two or more.

The most preferred cationic photoinitiator is a triarylsulfonium hexafluoroantimonate such as UVI-6974 (from Union Carbide).

The cationic photoinitiators may constitute from about 0.01% to about 3% by weight, more preferably, from about 0.02% to about 2 by weight, of the total radiation-curable composition.

(D) Free Radical Polymerization Initiators

In the compositions according to the invention, any type of photoinitiator that forms free radicals when the appropriate irradiation takes place can be used. Typical compounds of known photoinitiators are benzoins, such as benzoin, benzoin ethers, such as benzoin methyl ether, benzoin ethyl ether, and benzoin isopropyl ether, benzoin phenyl ether, and benzoin acetate, acetophenones, such as acetophenone, 2,2- dimethoxyacetophenone, 4-(phenylthio)acetophenone, and 1,1-dichloroacetophenone, benzil, benzil ketals, such as benzil dimethyl ketal, and benzil diethyl ketal, anthraquinones, such as 2-methylanthraquinone, 2-ethylanthraquinone, 2-tert-butylanthraquinone, 1-chloroanthraquinone, and 2-amylanthraquinone, also triphenylphosphine, benzoylphosphine oxides, such as, for example, 2,4,6-trimethylbenzoyldiphenylphosphine oxide (Lucirin® TPO), benzophenones, such as benzophenone, and 4,4'-bis(N,N'-dimethylamino)benzophenone, thioxanthones and xanthones, acridine derivatives, phenazene derivatives, quinoxaline derivatives or 1-phenyl-1,2-propanedione-2-O-benzoyloxime, 1-aminophenyl ketones or 1-hydroxyphenyl ketones, such as 1-hydroxycyclohexyl phenyl ketone, phenyl (1-hydroxyisopropyl)ketone and 4-isopropylphenyl(1-hydroxyisopropyl)ketone, or triazine compounds, for example, 4'methyl thiophenyl-1-di(trichloromethyl)-3,5 S-triazine, S-triazine-2-(stylbene)-4,6-bis-trichloromethyl, and paramethoxy stiryl triazine, all of which are known compounds.

Especially suitable free-radical photoinitiators, which are normally used in combination with a He/Cd laser, operating at for example 325 nm, an Argon-ion laser, operating at for example 351 nm, or 351 and 364 nm, or 333, 351, and 364 nm, or a frequency tripled YAG solid state laser, having an output of 351 or 355 nm, as the radiation source, are acetophenones, such as 2,2-dialkoxybenzophenones and 1-hydroxyphenyl ketones, for example 1-hydroxycyclohexyl phenyl ketone, 2-hydroxy-1-{4-(2-hydroxyethoxy)phenyl}-2-methyl-1-propane, or 2-hydroxyisopropyl phenyl ketone (also called 2-hydroxy-2,2-dimethylacetophenone), but especially 1-hydroxycyclohexyl phenyl ketone. Another class of free-radical photoinitiators comprises the benzil ketals, such as, for example, benzil dimethyl ketal. Especially an alpha-hydroxyphenyl ketone, benzil dimethyl ketal, or 2,4,6-trimethylbenzoyldiphenylphosphine oxide is used as photoinitiator.

Another class of suitable free radical photoinitiators comprises the ionic dye-counter ion compounds, which are capable of absorbing actinic rays and producing free radicals, which can initiate the polymerization of the acrylates. The compositions according to the invention that comprise ionic dye-counter ion compounds can thus be cured in a more variable manner using visible light in an adjustable wavelength range of 400 to 700 nanometers. Ionic dye-counter ion compounds and their mode of action are known, for example from published European-patent application EP 223587 and U.S. Pat. Nos. 4,751,102, 4,772,530 and 4,772,541.

Especially preferred is the free-radical photoinitiator 1-hydroxycyclohexyl phenyl ketone, which is commercially available as Irgacure I-184.

The free-radical initiators constitute from about 0.01% to about 3% by weight, most preferably, from about 0.01% to about 2% by weight, of the total radiation curable composition.

(E) Hydroxyl-Functional Compounds

The hydroxyl-functional compounds may be any organic material having a hydroxyl functionality of at least 1, and preferably at least 2. The material may be liquid or solid that is soluble or dispersible in the remaining components. The material should be substantially free of any groups which inhibit the curing reactions, or which are thermally or photolytically unstable.

Preferably, the hydroxyl-functional compounds are either aliphatic hydroxyl functional compounds or aromatic hydroxyl functional compounds.

The aliphatic hydroxyl functional compounds that may be useful for the present compositions include any aliphatic-type compounds that contain one or more reactive hydroxyl groups. Preferably these aliphatic hydroxyl functional compounds are multifunctional compounds (preferably with 2–5 hydroxyl functional groups) such as multifunctional alcohols, polyether-alcohols and polyesters.

Preferably the organic material contains two or more primary or secondary aliphatic hydroxyl groups. The hydroxyl group may be internal in the molecule or terminal. Monomers, oligomers or polymers can be used. The hydroxyl equivalent weight, i.e., the number average molecular weight divided by the number of hydroxyl groups, is preferably in the range of about 31 to 5000.

Representative examples of suitable organic materials having a hydroxyl functionality of 1 include alkanols, monoalkyl ethers of polyoxyalkyleneglycols, monoalkyl ethers of alkylene-glycols, and others.

Representative examples of useful monomeric polyhydroxy organic materials include alkylene glycols and polyols, such as 1,2,4-butanetriol, 1,2,6-hexanetriol, 1,2,3-heptanetriol, 2,6-dimethyl-1,2,6-hexanetriol, 1,2,3-hexanetriol, 1,2,3-butanetriol, 3-methyl-1,3,5-pentanetriol, 3,7,11,15-tetramethyl-1,2,3-hexadecanetriol, 2,2,4,4-tetramethyl-1,3-cyclobutanediol, 1,3-cyclopentanediol, trans-1,2-cyclooctanediol, 1,16-hexadecanediol, 1,3-propanediol, 1,4-butanediol, 1,5-pentanediol, 1,6-hexanediol, 1,7-heptanediol, 1,8-octanediol, 1,9-nonanediol.

Representative examples of useful oligomeric and polymeric hydroxyl-containing materials include polyoxyethylene and polyoxypropylene glycols and triols of molecular weights from about 200 to about 10,000; polytetramethylene glycols of varying molecular weight; copolymers containing pendant hydroxyl groups formed by hydrolysis or partial hydrolysis of vinyl acetate copolymers, polyvinylacetal resins containing pendant hydroxyl groups; hydroxyl-terminated polyesters and hydroxyl-terminated polylactones; hydroxyl-functionalized and polyalkadienes, such as polybutadiene; and hydroxyl-terminated polyethers. Other hydroxyl-containing monomers are 1,4-cyclohexanedimethanol and aliphatic and cycloaliphatic monohydroxy alkanols.

Other hydroxyl-containing oligomers and polymers include hydroxyl and hydroxyl/epoxy functionalized polybutadiene, polycaprolactone diols and triols, ethylene/butylenes polyols, and combinations thereof. Examples of polyether polyols are also polypropylene glycols of various molecular weights and glycerol propoxylate-B-ethoxylate triol, as well as linear and branched polytetrahydrofuran polyether polyols available in various molecular weights, such as for example 250, 650, 1000, 2000, and 2900 MW.

Preferred hydroxyl functional compounds are for instance simple multifunctional alcohols, polyether-alcohols, and/or polyesters. Suitable examples of multifunctional alcohols are, trimethylolpropane, trimethylolethane, pentaeritritol, di-pentaeritritol, glycerol, 1,4-hexanediol, 1,4-hexanedimethanol and the like.

Suitable hydroxyfunctional polyetheralcohols are, for example, alkoxylated trimethylolpropane, in particular the ethoxylated or propoxylated compounds, polyethyleneglycol-200 or -600 and the like.

Suitable polyesters include, hydroxyfunctional polyesters from diacids and diols with optionally small amounts of higher functional acids or alcohols. Suitable diols are those described above. Suitable diacids are, for example, adipic acid, dimer acid, hexahydrophthalic acid, 1,4-cyclohexane dicarboxylic acid and the like. Other suitable ester compounds include caprolactone based oligo- and polyesters such as the trimethylolpropane-triester with caprolactone, Tone®301 and Tone®310 (Union Carbide Chemical and Plastics Co., or UCCPC). The ester based polyols preferably have a hydroxyl number higher than about 50, in particular higher than about 100. The acid number preferably is lower than about 10, in particular lower than about 5. The most preferred aliphatic hydroxyl functional compound is trimethylolpropane, which is commercially available.

The aromatic hydroxyl functional compounds that may be useful for the present compositions include aromatic-type compounds that contain one or more reactive hydroxyl groups. Preferably these aromatic hydroxyl functional compounds would include phenolic compounds having at least 2 hydroxyl groups as well as phenolic compounds having at least 2 hydroxyl groups which are reacted with ethylene oxide, propylene oxide or a combination of ethylene oxide and propylene oxide.

The most preferred aromatic functional compounds include bisphenol A, bisphenol S, ethoxylated bisphenol A, ethoxylated bisphenol S.

These hydroxyl functional compounds are preferably present from about 3% to about 20% by weight, more preferably, from about 5% to about 16% by weight, of the total liquid radiation-cured composition.

(F) Epoxy Interpenetrating Polymer Compounds

An epoxy interpenetrating polymer compound of the present invention is any compound that contains two or more epoxy moieties and possesses sufficient toughness properties so that stereolithographic resin formulations that contain such compounds will have improved mechanical properties including tensile modulus, tensile strength and elongation at break as well as impact resistance. Examples of these epoxy interpenetrating polymer compounds are disclosed in U.S. Pat. No. 5,360,877. The preferred class of these compounds are referred to as EPRXE resins (see Patent No. 5,360,877 for a description), which are diepoxy resins. The preferred EPRXE resin is Taxtic 695 whose formula is shown on columns 10 and 11 of this patent and is now commercially available from Vantico, Inc. of Brewster, N.Y. Its general method of preparation appears to be disclosed in U.S. Pat. No. 4,594,291.

These epoxy interpenetrating polymer compounds are preferably present in amounts from about 3% to about 15% of the total radiation-curable composition. For the purpose of present invention, these epoxy interpenetrating compounds are not included within the scope of compound A, the cationic polymerizable compounds. The present invention includes both compounds.

(G) Optional Additives

If necessary, the resin composition for stereolithography applications according to the present invention may contain other materials in suitable amounts, as long as the effect of the present invention is not adversely affected. Examples of such materials include radical-polymerizable organic substances other than the aforementioned cationically polymerizable organic substances; heat-sensitive polymerization initiators, various additives for resins such as coloring agents such as pigments and dyes, antifoaming agents, leveling agents, thickening agents, flame retardant and antioxidant.

The two preferred optional compounds are core-shell rubber toughening particles and silica compounds such as a colloidal silica or fumed silica. The core-shell rubber toughening agent and the silica is added to increase the tensile strength and modulus of the final formulation, if needed.

A preferred core-shell rubber product is Paraloid Excel 2691 A, available from Rohm & Haas. It has a poly butyl acrylate core and a PMMA shell. If used, the preferred amount of the core-shell rubber product is from about 2% to about 12% by weight of the total radiation composition. If used, the preferred amount of a silica compound is from about 0.5% to about 7% by weight of the total radiation-curable composition.

Another preferred optional ingredient is a dispersing agent to aid the mixing of the epoxy interpenetrating polymer compound with the other ingredients. One preferred dispersing agent is ethoxylated phosphate (available as Merpol A from the Stepan Company of Northfield, Ill.) Preferably, it is used in amounts from about 0.001% to about 1% by weight of the total radiation-curable product.

Two other preferred optional additives are pyrene and benzyldimethylamine. The former acts as a sensitizer and the latter acts as a cationic stabilizer. If used, optional additives such as these preferably constitute from about 0.001% to about 5% by weight of the total liquid radiation-curable compositions.

For some applications, it is also desirable to use fillers. Optional fillers to be used in the present invention are reactive or non-reactive, inorganic or organic, powdery, fibrous or flaky materials. Examples of organic filler materials are polymeric compounds, thermoplastics, core-shell, aramids such as Kevlar®, nylon, cross-linked polystyrene, cross-linked poly (methyl methacrylate), polystyrene or polypropylene, cross-linked polyethylene powder, cross-linked phenolic resin powder, cross-linked urea resin powder, cross-linked melamine resin powder, cross-linked polyester resin powder and cross-linked epoxy resin powder. Examples of inorganic fillers are glass or silica beads, calcium carbonate, barium sulfate, talc, mica, glass or silica bubbles, zirconium silicate, iron oxides, glass fiber, asbestos, diatomaceous earth, dolomite, powdered metals, titanium oxides, pulp powder, kaolin, modified kaolin, hydrated kaolin metallic filers, ceramics and composites. Mixtures of organic and/or inorganic fillers can be used.

Further examples of preferred fillers are micro crystalline silica, crystalline silica, amorphous silica, alkali alumino silicate, feldspar, woolastonite, alumina, aluminum hydroxide, glass powder, alumina trihydrate, surface treated alumina trihydrate, alumina silicate. Each of the preferred fillers is commercially available. The most preferred filler materials are inorganic fillers, such as imsil, Novasite, mica, amorphous silica, feldspar, and alumina trihydrate. Mica as a filler is very attractive because it shows low tendency to settle out from the photocurable compositions. It has transparency to UV light, low tendency to refract or reflect incident light and it provides good dimensional stability and heat resistance.

The filler to be used for the resin composition for stereolithography according to the present invention must satisfy requirements that it hinders neither cationic nor radical polymerizations and the filled SL composition has a relatively low viscosity suitable for the stereolithography process. These fillers may be used alone or as a mixture of two or more of them depending upon the desired performance. The fillers used in the present invention may be neutral acidic or basic. The filler particle size may vary depending on the application and the desired resin characteristics. It may vary between 50 nanometers and 50 micrometers.

The filler material can optionally be surfaced treated with various compounds-coupling agents. Examples include methacryloxy propyl trimethoxy silane, beta-(3,4-epoxycyclohexyl)ethyl trimethoxy silane, gammaglycidoxy propyl trimethoxy silane and methyl triethoxy silane. The most preferred coupling agents are commercially available from Osi Chemicals Corp. and other chemical suppliers.

The filler loading is preferably from about 0.5 to about 90%, more preferably from about 5 to about 75%, most preferably from about 5 to about 60% by weight with respect to the total weight of the filled resin composition.

Formulation Preparation

The novel compositions can be prepared in a known manner by, for example, premixing individual components and then mixing these premixes, or by mixing all of the components using customary devices, such as stirred vessels, in the absence of light and, if desired, at slightly elevated temperature.

One preferred mixing method is to premix ingredients (A), (B), (C), (D) and (E) as forming a regular stereolithographic resin composition. The epoxy interpenetrating polymer compound (F) is separately heated to about 40° C. to about 80° C. to make it a mixable form. The previously mixture of ingredients (A), (B), (C), (D) and (E) are combined to this heated interpenetrating polymer compound (F) along with a small amount of a dispersion agent. These ingredients are thoroughly mixed in a suitable mixer or mixers for a sufficient amount of time. Preferably, optional ingredients such as the core-shell rubber product and the silica compound are then added.

One preferred liquid radiation-curable composition useful for the production of three dimensional articles by stereolithography that comprises (A) at least one cationically polymerizing organic substance comprising a mixture of:
  (1) 3,4-epoxycyclohexylmethyl-3',4'-epoxycyclohexanecarboxylate; and
  (2) trimethylol propane triglycidylether;

(B) at least one free-radical polymerizing organic substance comprising a mixture of:
  (1) at least one di(meth) acrylate of an aromatic diol; and
  (2) at least one tri-, tetra or pentafunctional monomeric or oligomeric aliphatic, cycloaliphatic or aromatic (meth) acrylate;

(C) at least one cationic polymerization initiator;

(D) at least one free radical polymerization initiator;

(E) hydroxyl-functional compounds that are a mixture of (1) trimethylolpropane; and (2) ethoxylated bisphenol A;

(F) at least one EPRXE resin;

(G) optional ingredients including (1) core-rubber particles; and (2) fumed silica or colloidal silica;

Process of Making Cured Three-Dimensional Articles

The above-noted novel compositions can be polymerized by irradiation with actinic light, for example by means of electron beams, X-rays, UV or VIS light, preferably with radiation in the wavelength range of 280–650 nm. Particularly suitable are laser beams of HeCd, argon or nitrogen and also metal vapor and NdYAG lasers. This invention is extended throughout the various types of lasers existing or under development that are to be used for the stereolithography process, e.g., solid state, argon ion, helium cadmium lasers, and the like. The person skilled in the art is aware that it is necessary, for each chosen light source, to select the appropriate photoinitiator and, if appropriate, to carry out sensitization. It has been recognized that the depth of penetration of the radiation into the composition to be polymerized, and also the operating rate, are directly proportional to the absorption coefficient and to the concentration of the photoinitiator. In stereolithography it is preferred to employ those photoinitiators which give rise to the highest number of forming free radicals or cationic particles and which enable the greatest depth of penetration of the radiation into the compositions which are to be polymerized.

The invention additionally relates to a method of producing a cured product, in which compositions as described above are treated with actinic radiation. For example, it is possible in this context to use the novel compositions as adhesives, as coating compositions, as photoresists, for example as solder resists, or for rapid prototyping, but especially for stereolithography. When the novel mixtures are employed as coating compositions, the resulting coatings on wood, paper, metal, ceramic or other surfaces are clear and hard. The coating thickness may vary greatly and can for instance be from 0.01 mm to about 1 mm. Using the novel mixtures it is possible to produce relief images for printed circuits or printing plates directly by irradiation of the mixtures, for example by means of a computer-controlled laser beam of appropriate wavelength or employing a photomask and an appropriate light source.

One specific embodiment of the above mentioned method is a process for the stereolithographic production of a three-dimensional shaped article, in which the article is built up from a novel composition with the aid of a repeating, alternating sequence of steps (a) and (b); in step (a), a layer of the composition, one boundary of which is the surface of the composition, is cured with the aid of appropriate radiation within a surface region which corresponds to the desired cross-sectional area of the three-dimensional article to be formed, at the height of this layer, and in step (b) the freshly cured layer is covered with a nevi layer of the liquid, radiation-curable composition, this sequence of steps (a) and (b) being repeated until an article having the desired shape is formed. In this process, the radiation source used is preferably a laser beam, which with particular preference is computer-controlled.

In general, the above-described initial radiation curing, in the course of which the so-called green models are obtained which do not as yet exhibit adequate strength, is followed then by the final curing of the shaped articles by heating and/or further irradiation.

The present invention is further described in detail by means of the following Examples and Comparisons. All parts and percentages are by weight and all temperatures are degrees Celsius unless explicitly stated otherwise.

EXAMPLES

The trade names of the components as indicated in the examples below correspond to the chemical substances as recited in the following Table 1.

TABLE 1

| Trade Name | Chemical Designation |
| --- | --- |
| SL5430 | stereolithographic resin available from Vantico, Inc. |
| SOMOS 10125 | stereolithographic resin available from DSM N.V. |
| Tactix 695 | EPRXE resin available from Vantico, Inc. |
| Merpol A | ethoxylated phosphate |
| Paraloid Excel 2691A | core-shell rubber particle product wherein the core is a poly butyl acrylate and the shell is PMMA |
| EFH-7501 | Needle-like Glass Fiber (75 microns) from Central Glass, Japan |
| Cab-O-Sil TS720 | fumed silica |
| West System 406 | colloidal silica |

The formulations indicated in the Examples and Comparisons below were prepared by the following mixing procedure.

1. Heat Tactix 695 in an oven, Model VWR 1675 available from VWR, at 70° C. for 1 hour.
2. Pour the amount of Tactix 695 needed into the stereolithographic resin.
3. Add 0.1% by weight of the total resin mixture of the Merpol A into the resin mixture.
4. Disperse the dispersion agent in the resin mixture using Ross Emulsifier, Model HSM-100L, with a speed of 8000 rpm for 20 minutes.
5. Add fumed silica and/or core-shell rubber and/or glass fiber compound into the resin and mix in Kenwood Mixer, Model Major classic KM800, for 10 minutes with dial set to 1 to make a premix paste consisting of resin and fillers.
6. Put the premix paste in Ross Mixer, Model 312-VF03L-089, and mix under vacuum for 20 minutes with dial set to 6.5.

Those formulations that did not include Taxtic 695 did not include steps (1) to (4).

The physical data of these three-dimensional specimens relating to these formulations was obtained as follows:

The measured post-cure mechanical properties of the formulations were determined on three-dimensional specimens produced stereolithographically with the aid of Nd-Yag-lasers. Each formulation made in these comparisons and examples were loaded into a vat of a stereolithography apparatus, such as an SLA 7000 system. The resulting specimens were dog-bone shaped and 165 mm in length and about 19 mm wide at the ends according to ASTM D638. The exposure for these specimens was 166.67 mJ/cm$^2$. Two set of data were obtained from these specimens which were subjected to the same manufacturing conditions, Green (G) denotes parts which were neither postcured in UV or thermal oven, while PCA stands for those parts that were postcured in an UV oven for 40 minutes. The UV oven used is a PCA made by 3D Systems and the energy dial was set to 10, indicating a full exposure. All the data were measured 48 hours after the specimens were made unless noted otherwise.

The Tensile Modulus (Msi), Tensile Strength (psig), Elongation at Break (%), were all determined according to the ASTM D638 method. The Impact Resistance (notched, Ft-lb/in) was determined according to the ASTM D256 method.

Comparison 1

The following components were mixed to produce a homogeneous liquid composition:

| Component | Percentage (by wt.) |
|---|---|
| Taxtic 695 | 100 |

Comparison 2

The following components were mixed to produce a homogeneous liquid composition:

| Component | Percentage (by wt.) |
|---|---|
| SL5430 | 100 |

Comparison 3

The following components were mixed to produce a homogeneous composition:

| Component | Percentage (by wt.) |
|---|---|
| SL 5430 | 96.2% |
| Fumed Silica | 3.8% |

Example 1

The following components were mixed to produce a homogeneous composition:

| Component | Percentage (by wt.) |
|---|---|
| SL 5430 | 67.4% |
| Fumed Silica | 3.8% |
| Taxtic 695 | 28.8% |

Example 2

The following components could be mixed to produce a homogeneous composition:

| Component | Percentage (by wt.) |
|---|---|
| SL 5430 | 86.5% |
| Taxtic 695 | 4.5% |
| Excel E2691A | 4.5% |
| Fumed Silica | 4.5% |

Example 3

The following components could be mixed to produce a homogeneous composition:

| Component | Percentage (by wt.) |
|---|---|
| SL 5430 | 81.9% |
| Taxtic 695 | 9.1% |
| Excel E2691A | 4.5% |
| Fumed Silica | 4.5% |

Example 4

The following components could be mixed to produce a homogeneous composition:

| Component | Percentage (by wt.) |
|---|---|
| SL 5430 | 88.7% |
| Taxtic 695 | 4.7% |
| Excel E2691A | 4.7% |
| Colloidal Silica | 1.9% |

Example 5

The following components could be mixed to produce a homogeneous composition:

| Component | Percentage (by wt.) |
|---|---|
| SL 5430 | 84.7% |
| Taxtic 695 | 4.5% |
| Excel E2691A | 9% |
| Colloidal Silica | 1.8% |

Example 6

The following components could be mixed to produce a homogeneous composition:

| Component | Percentage (by wt.) |
|---|---|
| SL 5430 | 80.2% |
| Taxtic 695 | 9% |
| Excel E2691A | 9% |
| Colloidal Silica | 1.8% |

The measured mechanical properties of these three formulations after curing with 90 minutes exposure to UV light after cured on platform are shown in Table 2.

TABLE 2

Mechanical Properites After 90 minutes UV Curing @ 120° C. and Then 1 Hour @ 160° C.

| Property | Example | | | |
|---|---|---|---|---|
| | C-1 | C-2 | C-3 | E-1 |
| Tensile Modulus (Msi) | 445 | 503 | 505 | 551 |
| Tensile Strength (psi) | 13000 | 6690 | 9630 | 7560 |
| Elongation at Break (%) | 5.6 | 2 | 2.1 | 1.7 |

*Data of C1 are taken from data sheet of Vantico's.

Comparisons C-3 to C-13 and Examples E-7 to E-9

The following Comparisons and Examples were conducted using the Somos 10120 resin instead of the SL5430 resin with same procedures noted above.

TABLE 3

Mechanical Properties after 48 Hours

| Example | Formulation | Modulus (Msi) | Tensile Strength (psi) | Elongation (%) |
|---|---|---|---|---|
| C-3 | ABS | 324 | 5600 | 12 |
| C-4 | S 10120+ | 228–315 | 2740–4800 | 4.47–7.75 |
| C-5 | 95%S10120/5%CS (G) | 344 | 7540 | 6.3 |
| C-6 | 95%S10120/5%FS (G) | 344 | 7270 | 7.9 |
| C-7 | 89%S10120/4%FS/6%GF (G) | 359 | 7350 | 3.5 |
| C-8 | 87%S10120/4%FS/9%GF (G) | 422 | 8200 | 4.2 |
| C-9 | 83%S10120/4%FS/13%GF (G) | 481 | 7940 | 3 |
| C-10 | 80%S10120/4%FS/9%2691A (PCA) | 260 | 5100 | 15.35 |
| C-11 | 80%S10120/4%FS/8%2691A/8% GF (PCA) | 314 | 5210 | 6.23 |
| C-12 | 84%S10120/4%FS/12%2691A (PCA) | 184 | 3470 | 13.82 |

TABLE 3-continued

Mechanical Properties after 48 Hours

| Example | Formulation | Modulus (Msi) | Tensile Strength (psi) | Elongation (%) |
|---|---|---|---|---|
| E-7 | 91%S10120/4.5%FS/4.5% Tactix (G) | 368 | 7700 | 7.04 |
| E-8 | 87%S10120/4.3%FS/4.3% Tactix/4.3% 2691A (G) | 299–327 | 5800–6700 | 9–15 |
| E-9 | 80%S10120/4% FS/16% Tactix (G) | 382 | 7310 | 5.4 |

+Data obtained using an SLA 7000 system made by 3D Systems, Inc. of Valencia, CA.

As shown by Table 3 that by adding Tactix 695 and 2691A, the formulation can produce an ABS-like material after cured by UV laser. Adding Tactix 695 alone as shown by the comparison between C4 and E-7, will form an interpenetrating network in the Somos 10120, and will result in an increase of both modulus and tensile strength of the final three-dimensional products. The additional incorporation of Paraloid Exl 2691A into the Tactix 695 containing formulation will allow the formulation to give not only an elongation close to that of ABS, but the modulus and the strength as well, as shown by comparison between C-3 and E-8.

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A liquid radiation-curable composition that comprises
   (A) at least one polymerizing organic substance;
   (B) at least one free-radical polymerizing organic substance;
   (C) at least one cationic polymerization initiator;
   (D) at least one free-radical polymerization initiator;
   (E) at least one hydroxyl-functional compound; and
   (F) at least one EPRXE resin.

2. The composition of claim 1 wherein component (A) is at least aliphatic, alicyclic or aromatic polyglycidyl compound or cyclopolyepoxide or epoxy cresol novolac or epoxy phenol novalac compound.

3. The composition of claim 1 wherein component (A) comprises a mixture of (1) at least one alicyclic epoxide having at least two epoxy groups; and (2) at least one difunctional or higher functional glycidylether of a polyhydric compound.

4. The composition of claim 3 wherein component (A)(1) is 3,4-epoxycyclohexylmethyl-3',4'-epoxycyclohexane carboxylate.

5. The composition of claim 1 wherein component (A)(2) is trimethylol propane triglycidylether.

6. The composition of claim 1 wherein the component (A) constitutes about 30% to about 80% by weight of the total radiation-curable composition.

7. The composition of claim 1 wherein component B is at least one solid or liquid poly(meth) acrylate.

8. The composition of claim 1 wherein component B comprises a mixture of (1) at least one aromatic di(meth)

acrylate compound and (2) optionally at least one trifunctional or higher functional (meth) acrylate compound.

9. The composition of claim 8 wherein component (B)(1) is a di(meth)acrylate of an aromatic diol.

10. The composition of claim 9 wherein the di(meth) acrylate of an aromatic diol is bisphenol A diglycidylether diacrylate.

11. The composition of claim 8 wherein component (B)(2) is present and is a tri-, tetra or pentafunctional monomeric or oligomeric aliphatic, cycloaliphatic, or aromatic (meth) acrylate.

12. The composition of claim 11 wherein component (B)(2) is dipentaerythritol monohydroxy-pentaacrylate.

13. The composition of claim 1 wherein component (B) constitutes from about 1% to about 5% by weight of the total liquid radiation-curable composition.

14. The composition of claim 1 wherein component (C) is triarylsulfonium hexafluoroantimonate.

15. The composition of claim 1 wherein component (C) constitutes from about 0.1 to about 5% by weight of the total liquid radiation-curable composition.

16. The composition of claim 1 wherein component (D) is 1-hydroxycyclohexyl phenyl ketone.

17. The composition of claim 1 wherein component (D) constitutes from about 0.1 to about 5% by weight of the total liquid radiation-curable composition.

18. The composition of claim 1 wherein component (E) is present and is trimethylolpropane and an ethoxylated bisphenol A.

19. The composition of claim 1 wherein component (E) is present from about 3% to about 20% by weight of the total liquid radiation-curable composition.

20. The composition of claim 1 wherein component (F) constitutes from about 3% to about 15% by weight of the total liquid radiation-cured composition.

21. The composition of claim 1 wherein the radiation-curable composition additionally contains a core-shell rubber toughening compound.

22. The composition of claim 1 wherein the radiation-curable composition additionally contains a silica compound.

23. The composition of claim 22 wherein the silica composition is either fumed silica or colloidal silica.

24. A liquid radiation-curable composition useful for the production of three dimensional articles by stereolithography that comprises (A) at least one cationically polymerizing organic substance;

(B) at least one free-radical polymerizing organic substance;

(C) at least one cationic polymerization initiator;

(D) at least one free radical polymerization initiator;

(E) a mixture of trimethylolpropane and an ethoxylated bisphenol A;

(F) at least one EPRXE resin; and (G) a mixture of a core-shell rubber toughening compound and a silica compound.

25. A process for forming a three-dimensional article, said process comprising the steps:

(1) coating a thin layer of a composition onto a surface;

(2) exposing said thin layer imagewise to actinic radiation to form an imaged cross-section, wherein the radiation is of sufficient intensity to cause substantial curing of the thin layer in the exposed areas;

(3) coating a thin layer of the composition onto the previously exposed imaged cross-section;

(4) exposing said thin layer from step (3) imagewise to actinic radiation to form an additional imaged cross-section, wherein the radiation is of sufficient intensity to cause substantial curing of the thin layer in the exposed areas and to cause adhesion to the previously exposed imaged cross-section;

(5) repeating steps (3) and (4) a sufficient number of times in order to build up the three-dimensional article;

wherein the composition is that which is described in claim 1.

* * * * *